(12) United States Patent
Dai et al.

(10) Patent No.: US 11,749,184 B1
(45) Date of Patent: Sep. 5, 2023

(54) LED LIGHT EMITTING PIXEL ARRANGEMENT STRUCTURE AND DISPLAY PANEL DEVICE

(71) Applicant: Voxel Inc, West Sacramento, CA (US)

(72) Inventors: Zhiming Dai, Guangdong (CN); Haoyi Zhang, Guangdong (CN)

(73) Assignee: Voxel Inc, West Sacramento, CA (US)

( * ) Notice: Subject to any disclaimer, the term of this patent is extended or adjusted under 35 U.S.C. 154(b) by 0 days.

(21) Appl. No.: 18/131,406

(22) Filed: Apr. 6, 2023

(51) Int. Cl.
*G09G 3/32* (2016.01)
*H01L 25/16* (2023.01)

(52) U.S. Cl.
CPC ............. *G09G 3/32* (2013.01); *H01L 25/167* (2013.01); *G09G 2300/0452* (2013.01); *G09G 2300/0465* (2013.01); *G09G 2300/0469* (2013.01); *G09G 2320/0626* (2013.01); *G09G 2320/0666* (2013.01); *G09G 2330/021* (2013.01)

(58) Field of Classification Search
CPC ............. G09G 3/32; G09G 2300/0452; G09G 2300/0465; G09G 2300/0469; G09G 2320/0626; G09G 2330/021; G09G 2320/0666; H01L 25/167
See application file for complete search history.

(56) References Cited

U.S. PATENT DOCUMENTS

| 2013/0076236 A1* | 3/2013 | Sumida | H10K 50/858 313/504 |
| 2014/0284570 A1* | 9/2014 | Jinta | H10K 59/352 257/40 |
| 2022/0310707 A1* | 9/2022 | Li | H10K 71/00 |

\* cited by examiner

*Primary Examiner* — Muhammad N Edun (57) ABSTRACT

Disclosed are an LED light emitting pixel arrangement structure and a display panel device. The pixel arrangement structure includes a plurality of first pixel sets and a plurality of second pixel sets, the first pixel set includes a plurality of E pixels arranged in a row, the second pixel set includes a center pixel and pixels A, pixels B, pixels C, and pixels D that take the center sub-pixel as a center and are sequentially distributed in a semicircular arc, three separate white light points are formed in each second pixel set, and each separate white light point is formed by the cooperation of the center sub-pixel and any adjacent pixel on the corresponding semicircular arc; and control modes of the first pixel set 1 and the second pixel set 2 are both separate electric control, to control an on-off order and frequency of the separate white light points.

7 Claims, 7 Drawing Sheets

LED LIGHT EMITTING PIXEL ARRANGEMENT STRUCTURE AND DISPLAY PANEL DEVICE

TECHNICAL FIELD

The present application relates to the field of self-light emitting display field, and particularly relates to an LED light emitting pixel arrangement structure and display panel device.

BACKGROUND ART

In a flat panel display technology, a Micro (Mini) inorganic light emitting diode (LED) display is generally accepted and recognized by the industry as a fourth generation display technology after a LCD display, an OLED display and an LED signage due to numerous advantages such as, such as lightness and thinness, active lighting, a fast response speed, a wide angle of view, rich colors, high brightness, low power consumption and high and low temperature resistance. Therefore, large-size, high-resolution panels are realized, which are the focus of current research and the development direction of future display technology.

With the development of display technology, people also put forward increasingly higher requirements for the resolution and brightness of display screens. For high-resolution display panels, the increasingly smaller distance between pixel light emitting zones is needed due to the higher requirements for resolution. However, limited by the COB packaging manufacturing process, a higher pixel density (pixels per inch) is unable to be obtained. Reducing the pitch among red, green, and blue light pixels will cause the pixels of different colors in the substrate pixel, thereby affecting the display effect of the screen. Therefore, the resolution of the LED panels in the prior art needs to be improved.

The inventors found that the pixel arrangement structure of the existing display panel is incapable of expressing curves and oblique lines well, and it is easy to form jagged lines. Moreover, it causes obvious graininess visually, which greatly affects the clarity of the pictures.

Figure 1:
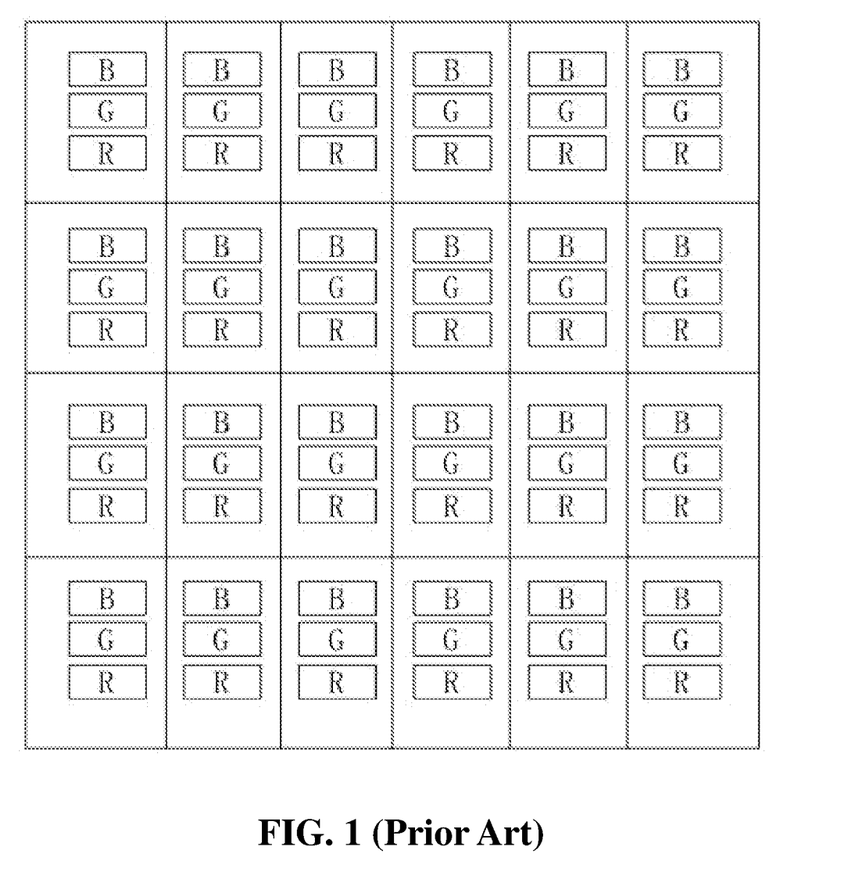
FIG. 1 is a schematic structural diagram of the related art 1.

In the related art 1, as shown in FIG. 1, in the existing LED-COB display screen pixels, one red light pixel, one green light pixel, and one blue light pixel are combined into an separate pixel, and the distance between adjacent pixels is greater than that between the pixels within pixel A, therefore, separate pixels are gathered together such that a single group of pixels will show obvious graininess when displaying the picture, lacking the display effect of surface light source. Specifically, in FIG. 1, a pixel set is composed of one red light pixel, one green light pixel, and one blue light pixel side by side, and the composed pixel can emit white light. However, the distance between two adjacent pixels is much greater than that between the internal pixels, which causes obvious granular sensation. Such a method is difficult to meet the requirements of electronic devices and for high-resolution and high-brightness display screens needed by high-definition image signal sources.

Figure 2:
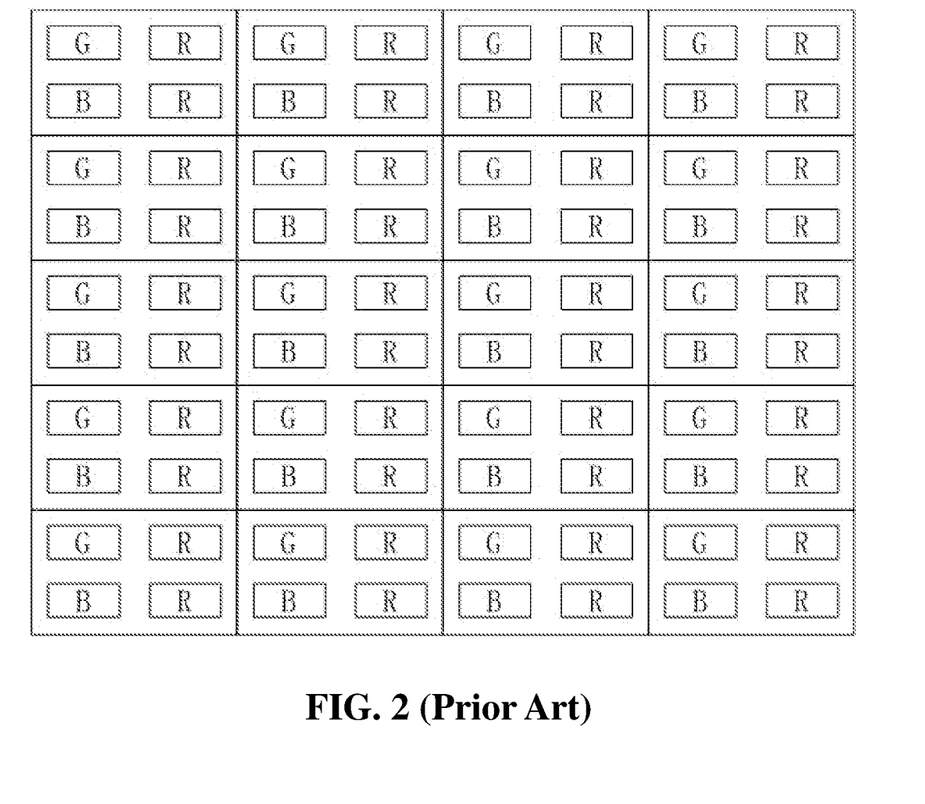
FIG. 2 is a schematic structural diagram of the related art 2.

In the related art 2, as shown in FIG. 2, in the existing LED-COB display screen pixels, one red light pixel, two green light pixels and one blue light pixel are combined into an separate pixel, and the distance between two adjacent pixels is close to the distance between the pixels within pixel A, therefore, the present solution is capable of improving the display uniformity of products, but the pixel density is not improved because the cost of one pixel of the display product increases, in which case, the cost is relatively high, moreover, it is difficult to identify mixing color rationing.

SUMMARY

In order to improve the pixel density of the display panels and reduce the pixel graininess, the present application provides an LED light emitting pixel arrangement structure and a display panel device.

In a first aspect, an LED light emitting pixel arrangement structure provided by the present application adopts the following technical solution:

an LED light emitting pixel arrangement structure, characterized in that it is used in the field of micro-LED or mini-LED self-light emitting display, including a plurality of first pixel sets and a plurality of second pixel sets, the second pixel set includes a center pixel, pixels A, pixels B, pixels C, and pixels D, the pixel A, pixel B, pixel C, and pixel D take the center pixel as a center and are sequentially distributed in a semicircular arc, the center pixel, pixel A, pixel B, pixel C, and pixel D are one of red light pixel, green light pixel or blue light pixel separately, the colors of the pixel C and the pixel D are the same as those of the pixel A and the pixel B separately, and the center pixel cooperates with any other two adjacent pixels to form an separate white light zone; and the first pixel set includes a plurality of E pixels arranged in a row, the colors of the E pixels are the same as that of the center pixel, the second pixel set is located between the adjacent first pixel sets, the pixel A, pixel B, pixel C, and pixel D in the second pixel set are used as a reconstruction pair separately, the arrangement structure of the pixels forms a reconstruction location on the side of the reconstruction pair away from the center pixel, the E pixels in the first pixel set are arranged on the reconstruction location and cooperate with the adjacent reconstruction pairs to form a first reconstruction white light zone, and control modes of the first pixel set and the second pixel set are both separate electric control, to control an on-off order and frequency of the separate white light zone and the first reconstruction white light zone.

In a preferred embodiment, the center pixel is arranged in an equilateral triangle with any corresponding pair of the reconstruction pair, and the reconstruction pair and the E pixel on the corresponding reconstruction location are arranged in an equilateral triangle with.

In a preferred embodiment, the second pixel set is arranged longitudinally in a single row between the adjacent first pixel sets, in any of the two second pixel sets adjacent above and below, the pixel A, pixel B, pixel C and pixel D in the second pixel set located above form a regular hexagonal structure with the pixel B and pixel C in the second pixel set located below, the pixel A, pixel B, pixel C and pixel D in a lower portion of the regular hexagonal structure cooperate with the center pixel at the center of the regular hexagonal structure to form three second reconstruction white light zones, and the adjacent two second pixel sets control on-off of pixels inside the second pixel sets respectively, to control an on-off order and frequency of the second reconstruction white light zones.

In a preferred embodiment, the pixel A, the pixel B, the pixel C, and the pixel D in a lower portion of the regular hexagonal structure are divided into two matched pairs on the left and right, the matched pairs and the E pixels on the adjacent reconstruction locations cooperate to form third white light zones, the adjacent two second pixel sets separately control the on-off of their own pixels, and the first pixel sets control the on-off of their own E pixels to control the on-off of the third white light zones.

In a preferred embodiment, a complementary color position is provided between the reconstruction locations on the edge of the pixel arrangement structure, a third pixel set is arranged on the complementary color position, the third pixel set includes complementary color sub-pixels, the complementary color sub-pixel is a pixel A or a pixel B, the complementary color position is opposite to the adjacent pixel A or pixel D, the complementary color position relative to the pixel A is used to add the complementary color sub-pixel of the pixel B, and the complementary color position relative to the pixel D is used to add the complementary color sub-pixel of the pixel A.

In a preferred embodiment, the center pixel is a red light pixel, the pixel A is a blue light pixel, the pixel B is a green light pixel, the pixel C is a blue light pixel, and the pixel D is a green light pixel;

or, the center pixel is a red light pixel, the pixel A is a green light pixel, the pixel B is a blue light pixel, the pixel C is a green light pixel, and the pixel D is a blue light pixel;

or, the center pixel is a blue light pixel, the pixel A is a red light pixel, the pixel B is a green light pixel, the pixel C is a red light pixel, and the pixel D is a green light pixel;

or, the center pixel is a blue light pixel, the pixel A is a green light pixel, the pixel B is a red light pixel, the pixel C is a green light pixel, and the pixel D is a red light pixel;

or, the center pixel is a green light pixel, the pixel A is a red light pixel, the pixel B is a blue light pixel, the pixel C is a red light pixel, and the pixel D is a blue light pixel; and or, the center pixel is a green light pixel, the pixel A is a blue light pixel, the pixel B is a red light pixel, the pixel C is a blue light pixel, and the pixel D is a red light pixel.

In a second aspect, a display panel device provided by the present application adopts the following technical solution:

a display panel device, including a display panel composed of Micro/Mini-type red, green and blue LED flip-chips packaged using a PCB substrate or a glass substrate COB, and the display panel is provided with the above pixel arrangement structure.

To sum up, the present application includes at least one of the following beneficial technical effects:

1. By changing the arrangement structure of Micro-LED/Mini-LED pixels, the present solution makes the arrangement of white light emitting zones formed by RGB pixels more uniform, thereby avoiding visual pixel graininess, obtaining a higher pixel density and improving the resolution of the display panel. At the same time, the present solution also has the advantages of increasing the distance between pixels of different colors, improving the color mixing of pixels per unit panel size and the representation of curves and oblique lines, alleviating the cross-color phenomenon between pixel, and reducing the power consumption of the entire display panel at the same pixel density.

2. Further, the present solution realizes a cost reduction compared with the traditional pixel arrangement scheme, and realizes the improvement of the physical RGB pixel group through the spatial reconstruction of pixels, reduces the average physical cost of a single group of pixels, and effectively improves the cost performance of products.

In the figures, 1. first pixel set; 2. second pixel set; 201. center pixel; 202. pixel A; 203. pixel B; 204. pixel C; 205. pixel D; 301. separate white light zone; 302. first reconstruction white light zone; 304. third white light zone; 4. third pixel set; and 401. complementary color pixel.

DETAILED DESCRIPTION OF THE EMBODIMENTS

The present application will be further described in detail below in conjunction with FIGS. 3-7.

An embodiment of the present application discloses an LED light emitting pixel arrangement structure, the pixel arrangement structure is used in the field of micro-LED or mini-LED self-light emitting display, including a plurality of first pixel sets 1 and a plurality of second pixel sets 2, the second pixel set includes a center pixel 201, pixel A 202, pixel B 203, pixel C 204, and pixel D 205, the pixel A 202, pixel B 203, pixel C 204, and pixel D 205 take the center sub-pixel as a center and are sequentially distributed in a semicircular arc, the center pixel 201, pixel A 202, pixel B 203, pixel C 204, and pixel D 205 are any of red light pixel, green light pixel or blue light pixel separately, the colors of the pixel C 204 and the pixel D 205 are the same as those of the pixel A 202 and the pixel B 203 separately, and the center pixel 201 cooperates with any other two adjacent pixels to form an separate white light zone 301; and the first pixel set 1 includes a plurality of E pixels arranged in a row, the colors of the E pixels are the same as that of the center pixel 201, the second pixel set is located between the adjacent first pixel sets 1, the pixel A 202, pixel B 203, pixel C 204, and pixel D 205 in the second pixel set 2 are used as a reconstruction pair separately, the arrangement structure of the pixels forms a reconstruction location on the side of the reconstruction pair away from the center pixel 201, the E pixels in the first pixel set 1 are arranged on the reconstruction location and cooperate with the adjacent reconstruction pairs to form a first reconstruction white light zone 302, and control modes of the first pixel set 1 and the second pixel set 2 are both separate electric control, to control an on-off order and frequency of the separate white light zone 301 and the first reconstruction white light zone 302. Specifically, with reference to FIG. 3, the pixel arrangement structure is divided according to a driving relationship, and includes a plurality of first pixel sets 1 and a plurality of second pixel sets 2, where the first pixel set 1 includes a plurality of E pixels arranged in a row, in some embodiments, the first pixel sets 1 may be arranged a single row of curves due to differences in substrate materials and product types, and in other embodiments, the first pixel sets 1 may be arranged in a single row of straight lines, with only the two adjacent groups of first pixel sets 1 being parallel to each other or overlapping in translation.

Figure 3:
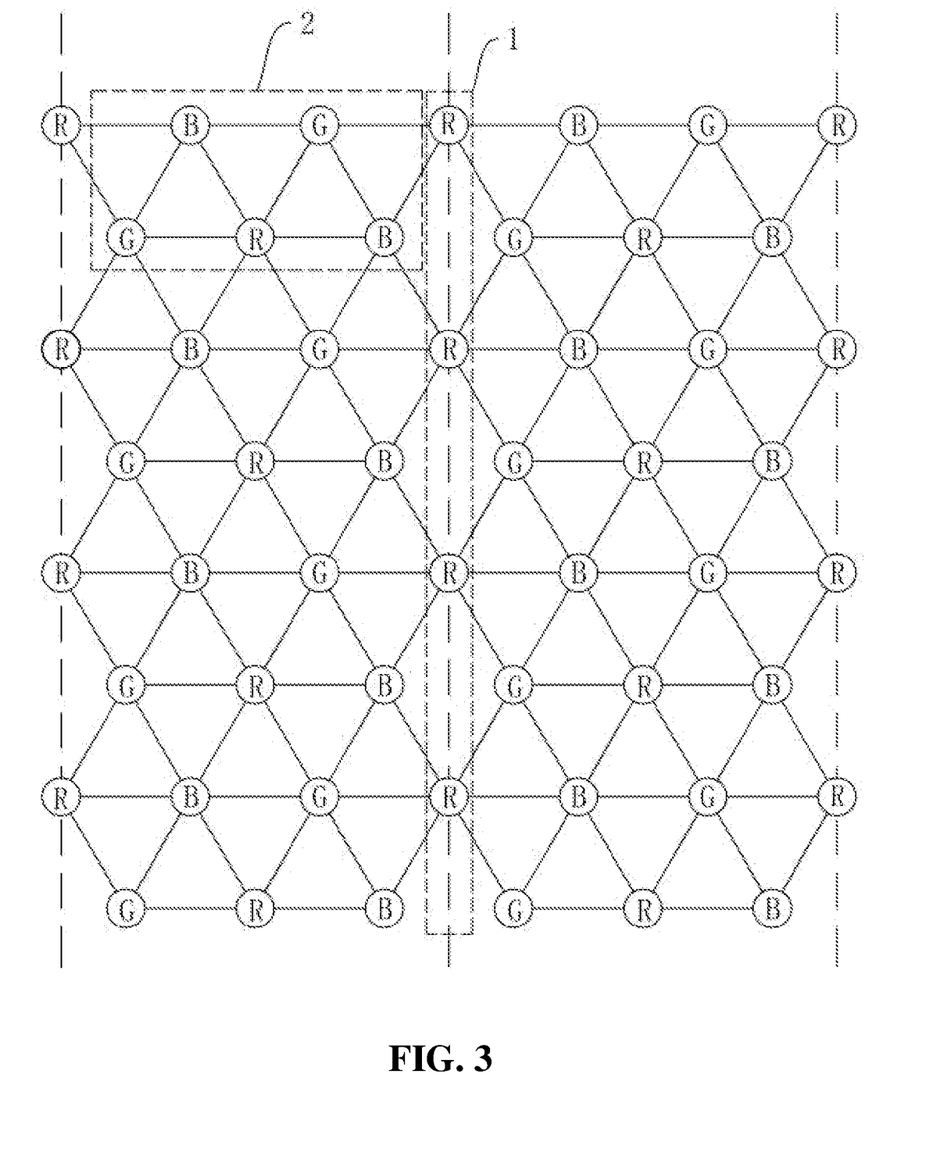
FIG. 3 is a schematic structural diagram of an LED light emitting pixel arrangement structure in an embodiment of the present application.
Figure 4:
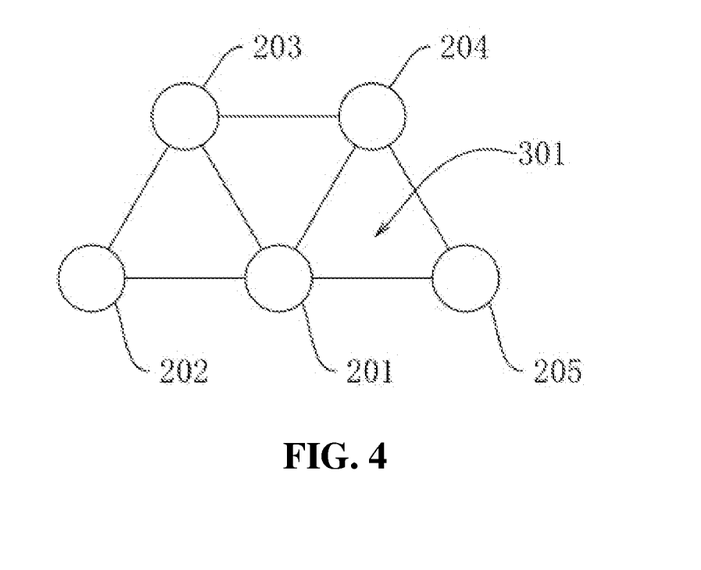
FIG. 4 is a schematic structural diagram of a second pixel set 2 in some embodiments of the present application.

With reference to FIGS. 3 and 4, a plurality of second pixel sets 2 are provided and arranged two adjacent first pixel sets 1, specifically, each second pixel set 2 is arranged in the extension direction of the first pixel set 1. The second pixel set 2 includes the center pixel 201 and the pixel A 202, the pixel B 203, the pixel C 204, and the pixel D 205 that take the center pixel 201 as a center and are sequentially distributed in a semicircle.

The center pixel 201, the pixel A 202 and the pixel B 203 are one of red light pixel, green light pixel or blue light pixel separately. Compared with OLEDs, the areas of red light pixel, blue light pixel and green light pixel are the same, without compensatory increase in the light emitting area of blue and red light pixels, therefore, the corresponding relationship among the center pixel 201, the pixel A 202 and the pixel B 203, and the green light pixel, red light pixel and blue light pixel may have different choices in different embodiment. Specifically, in some embodiments, the pixel A 202 is a red light pixel, the pixel B 203 is a blue light pixel, and the pixel C 204 is a green light pixel; in other embodiments, the pixel A 202 is a red light pixel, the pixel B 203 is a green light pixel, and the pixel C 204 is a blue light pixel; in other embodiments, the pixel A 202 is a blue light pixel, the pixel B 203 is a red light pixel, and the pixel C 204 is a green light pixel; in some embodiments, the pixel A 202 is a blue light pixel, the pixel B 203 is a green light pixel, and the pixel C 204 is a red light pixel; in other embodiments, the pixel A 202 is a green light pixel, the pixel B 203 is a red light pixel, and the pixel C 204 is a blue light pixel; and in some other embodiments, the pixel A 202 is a green light pixel, the pixel B 203 is a blue light pixel, and the pixel C 204 is a red light pixel. Without limitation, the present embodiment is exemplified by making the pixel A 202 being a red light pixel, the pixel B 203 being a blue light pixel, and the pixel C 204 being a green light pixel.

By adopting the above technical solution, a single second pixel set 2 is composed of five pixels, forming three separate white light emitting zones inside, and each white light emitting zone is surrounded by a center pixel 201, a pixel A 202 and a pixel B 203, that is, three groups of RGB form three white light emitting zone, and the light emitting points do not need to be generated by the cooperation of the first pixel set 1, so they are called separate light emitting zones 301. At the same time, each reconstruction pair can cooperate with the pixels on the adjacent first pixel set 1 to form the first reconstruction white light zone 302, that is, an additional pixel point is added, and at least one white light zone is obtained. Compared with the related art 2, it is beneficial to improving the pixel density and reducing the power consumption of the whole panel at the same time.

The second pixel set 2 is located between the adjacent first pixel sets 1, thus presenting an arrangement rule of the first pixel set 1—the second pixel set 2—the first pixel set 1 in the horizontal direction. Compared with the related art 1, a plurality of white light zones are distributed continuously and evenly in the horizontal direction, and the distance between adjacent white light zones is on the same order of magnitude or even the same as that between pixels, so that the graininess of pixels is significantly reduced, which can better meet the requirements of electronic devices and for high-resolution and high-brightness display screens needed by high-definition image signal sources.

Figure 5:
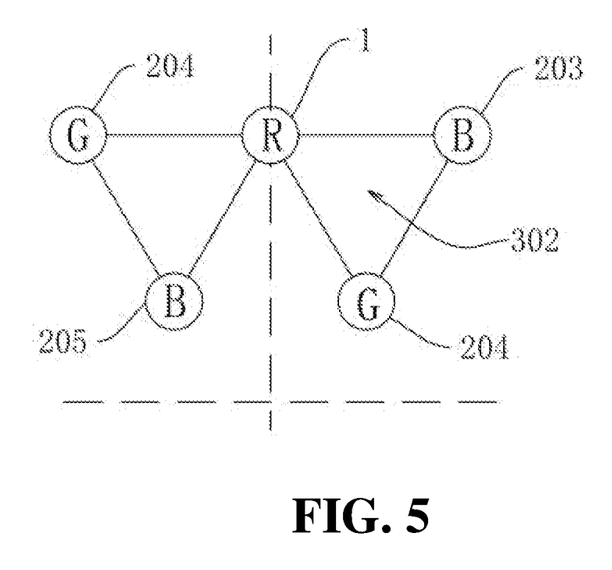
FIG. 5 is a schematic diagram of the present application for illustrating the coordination relationship between a first pixel set 1 and a second pixel set 2 in some embodiments.

With reference to FIG. 3 and FIG. 5, the pixel A 202 and the pixel B 203, the pixel C 204 and the pixel D 205 form a reconstruction pair, respectively, the arrangement structure of the pixels forms a reconstruction location on the side of the reconstruction pair away from the center pixel 201, the E pixels in the first pixel set 1 are arranged on the reconstruction location and cooperate with the adjacent reconstruction pairs to form the first reconstruction white light zone 302. Further, the reconstruction pair and the center pixel 201 on the corresponding reconstruction location are arranged in an equilateral triangle. It presents an arrangement rule of the first pixel set 1—the second pixel set 2—the first pixel set 1 in the horizontal direction, a plurality of white light zones are distributed continuously and evenly in the horizontal direction, and the distance between adjacent white light zones is the same as that between pixels, so that the graininess of pixels is significantly reduced, which can better meet the requirements of electronic devices and for high-resolution and high-brightness display screens needed by high-definition image signal sources.

Further, each reconstruction pair can cooperate with the pixels on the adjacent first pixel set 1 to form the first reconstruction white light zone 302, that is, an additional pixel point is added, and at least one white light zone is obtained. Compared with the related art 2, it is beneficial to improving the pixel density and reducing the power consumption of the whole panel at the same time.

Further, in the present embodiment, the second pixel set 2 is arranged longitudinally in a single row between the adjacent first pixel sets 1, in any of the two second pixel sets 2 adjacent above and below, the pixel A 202, pixel B 203, pixel C 204 and pixel D 205 in the second pixel set 2 located above form a regular hexagonal structure with the pixel B 203 and pixel C 204 in the second pixel set 2 located below, the pixel A 202, pixel B 203, pixel C 204 and pixel D 205 in a lower portion of the regular hexagonal structure cooperate with the center pixel 201 at the center of the regular hexagonal structure to form three second reconstruction white light zones 303, and the adjacent two second pixel sets 2 separately control the on-off of their own pixels to control the on-off sequence and on-off frequency of the second reconstruction white light zones 303;

specifically, for any two second pixel sets 2 adjacent above and below, their relative distances may vary in in different embodiments. In order to avoid distortion of spatial pixels, in some embodiments, the pixel A 202, pixel B 203, pixel C 204 and pixel D 205 in the second pixel set 2 located above form a regular hexagonal structure with the pixel B 203 and pixel C 204 in the second pixel set 2 located below, and the four pixels in a lower portion of the regular hexagonal structure cooperate with the center pixel 201 at the center of the regular hexagonal structure to form three second reconstruction white light zones 303. As a result, all the pixels of the first pixel set 1 and the second pixel set 2 are arranged in an overall uniform net, and two adjacent second pixel sets 2 are capable of spatially reconstructing to emit white light three times, and the pixel sets of each second reconstruction white light zone 303 are all 1R1G1B, with the pixel being 1:1:1 and the white light color mixing being 3:6:1. The distance between the white light emitting zones is uniform in a lateral direction and a longitudinal direction, and the pixel arrangement is more uniform, thereby avoiding visual pixel graininess. In addition, the second pixel sets 2 not only emits three times of white light itself, but also emits three times of white light with the adjacent second pixel set 2, so as to obtain a higher pixel density, thereby improving the resolution of display panels, and also improving modulation capability of light emitting of the single pixel set.

Control modes of the first pixel set 1 and the second pixel set 2 are both separate electric control, to control an on-off order and frequency of the separate white light zone 301 and the first reconstruction white light zone 302, and the adjacent two second pixel sets 2 control the on-off of pixels inside the second pixel sets respectively, to control an on-off order and frequency of the second reconstruction white light zones 303. Specifically, the on-off of each of the pixels needs to be controlled by a driver, the on-off of the white light zone is controlled by the on-off of the pixel, and the pixel is subjected to pulse-width modulation (PWM), so as to control brightness of the white light zone. In the present solution, five separate light emitting points in the second pixel set 2 are driven by a group of drivers, so as to enable second pixel set 2 to continuously and repeatedly emit white light, thereby prolonging a light emitting period. The center pixel 201 in the first pixel set 1 is also controlled by the driver, so as to match the driver of the second pixel, to control the on-off and the light intensity of the reconstruction white light zone.

In addition, compared with the related art 1, the same type of pixels in the present solution are staggered each other and not arranged on the same straight line, thereby being conducive to color mixing of pixels in a unit panel size, improving expressiveness of a curve and an oblique line, ensuring increase in the pixel density, and simultaneously reducing a cross-color phenomenon between pixels.

In the related art 1 and the related art 2, the on-off of each of the pixels needs to be controlled by a driver, the on-off of the white light zone is controlled by the on-off of the pixel, and the pixel is subjected to the pulse-width modulation (PWM), so as to control brightness of the white light zone. That is, in the related art, three pixel points or four pixel points are driven by one driver. In the present solution, five separate light emitting points in the second pixel set 2 are driven by a group of drivers (three drivers), so as to enable the second pixel set 2 to continuously and repeatedly emit white light, thereby prolonging a light emitting period. The center pixel 201 in the first pixel set 1 is also controlled by the driver, so as to match the driver of the second pixel, to control the on-off and the light intensity of the reconstruction white light zone.

For a liquid crystal display (LCD) technology or oxide light emitting diode (OLED) technology, a pixel point may be controlled by means of a thin film transistor (TFT), and the TFT is usually made of metal oxide for control of liquid crystal or light emitting oxide, is of a thin film structure, is usually located on a light path, has certain light transmittance, and is provided with a light transmission opening. That is, the denser the pixel is, the smaller the light transmission opening is if a size of the drive is unchanged. Therefore, the number of drives restricts display quality. In the present solution, the drive may be arranged on a back surface of the pixel, and therefore the number of the drives does not influence amount of light transmission, and a wide range of drivers may be used with the high pixel density, to increase a wide range of display indexes.

In addition, in the OLED technology, diamond arrangement and RGB delta pixel arrangement of a RGB pixel point of the related art are superficially approximate to the present solution, but in fact, there are substantial differences. The diamond arrangement and BOE delta arrangement aim to solve the problem of great differences in the lifespan of RGB three-color pixels in OLED, which is commonly known as the screen burn-in problem. When an arrangement method similar to that in the related art 1 is adopted, obvious chromatic aberration will occur after long-term use. Therefore, the BOE delta arrangement enables the areas of blue light pixels and red light pixels with lower lifespans larger to compensate for chromatic aberration. Moreover, adopting the diamond arrangement or BOE delta arrangement will lead to decrease in pixel density. However, the arrangement method in the present solution aims to solve the problem of lower pixel density. Since the lifespans of red light pixels, green light pixels, and blue light pixels are close, which imposes no limitation on the corresponding relationship between the center pixel 201, pixel A 202 and pixel B 203, and red light pixels, green light pixels, and blue light pixels, only one-to-one correspondence is needed, that is, six corresponding relationships may be allowed, which is impossible for the diamond arrangement and the BOE delta arrangement. Similarly, the center pixel 201, pixel A 202 and pixel B 203 are also arranged in similar areas, so that a denser arrangement can be achieved, which is also impossible for the diamond arrangement and the BOE delta arrangement.

Further, in the present embodiment, the center pixel 201 is arranged in an equilateral triangle with any corresponding pair of the reconstruction pair, and the reconstruction pair and the E pixel on the corresponding reconstruction location are arranged in an equilateral triangle with. Specifically, the central angle formed by the center pixel 201 and any pair of adjacent pixels on the corresponding semicircular arc may be different. In some embodiments, a central angle of 65° or 55° or other non-60° central angles may be formed. Since a triangle formed by the center pixel 201 and the adjacent pairs of pixels on the corresponding semicircle arc is not an equilateral triangle, a distortion of spatial pixels will occur. In order to correct the distortion, the hue location needs to be adjusted, and a control system may be control to perform a spatial pixel shift. In order to reduce the computation of the control system, in the present embodiment, the central angles formed by the center pixel 201 and any pair of adjacent pixels on the corresponding semicircular arc all form 60° central angles. That is, an equilateral triangle is formed by the pixel A 202, the pixel B 203 and the center pixel 201, an equilateral triangle is formed by the pixel B 203, the pixel C 204 and the center pixel 201, and an equilateral triangle is formed by the pixel C 204, the pixel D 205 and the center pixel 201. In other words, when the pixel A 202, the pixel B 203, the pixel C 204, the pixel D 205, the center pixel 201 and the pixel A 202 are sequentially connected, an isosceles trapezoid is formed, two end points of the bottom edge of the isosceles trapezoid are the pixel A 202 and the pixel D 205, and two end points of the top edge are the pixel B 203 and the pixel C 204. since the reconstruction pair and the E pixel on the corresponding reconstruction location are arranged in an equilateral triangle with, the separate white light points and the first reconstruction white light points are uniformly arranged, a space pixel is not distorted compared with other angular arrangement modes, or there is no need to adjust a hue position in order to correct distortion, and no need to shift the space pixel by a control system.

Further, in the present embodiment, the pixel A 202, the pixel B 203, the pixel C 204, and the pixel D 205 in a lower portion of the regular hexagonal structure are divided into two matched pairs on the left and right, the matched pairs and the E pixels on the adjacent reconstruction locations cooperate to form third white light zones 304, the adjacent two second pixel sets 2 separately control the on-off of their own pixels, and the first pixel sets 1 control the on-off of their own E pixels to control the on-off of the third white light zones 304.

Figure 6:
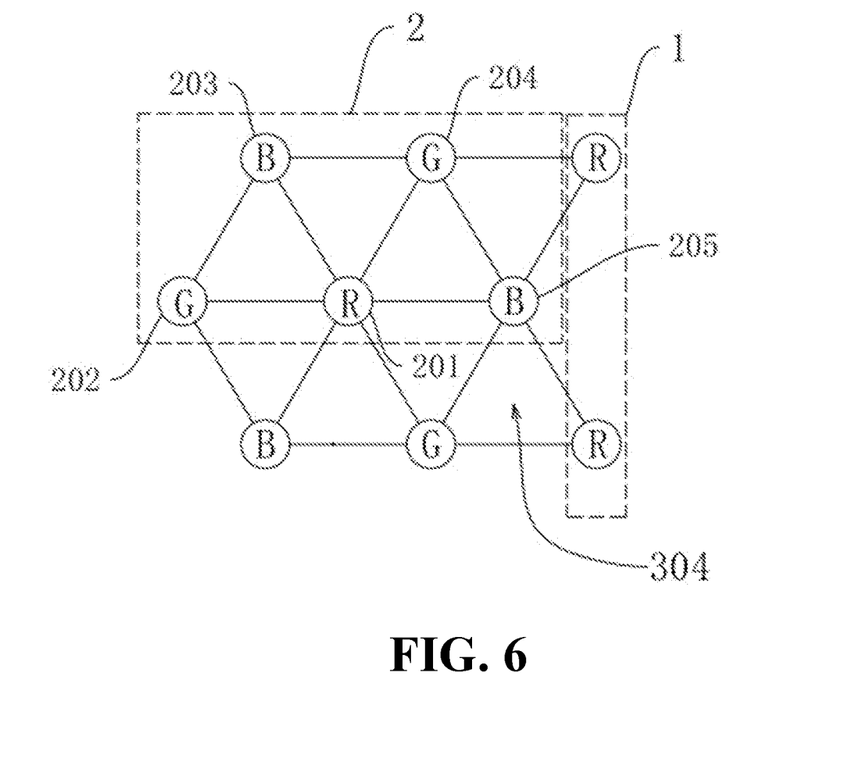
FIG. 6 is a schematic diagram of the present application for illustrating the coordination relationship between two adjacent second pixel sets 2 in some embodiments.
Figure 7:
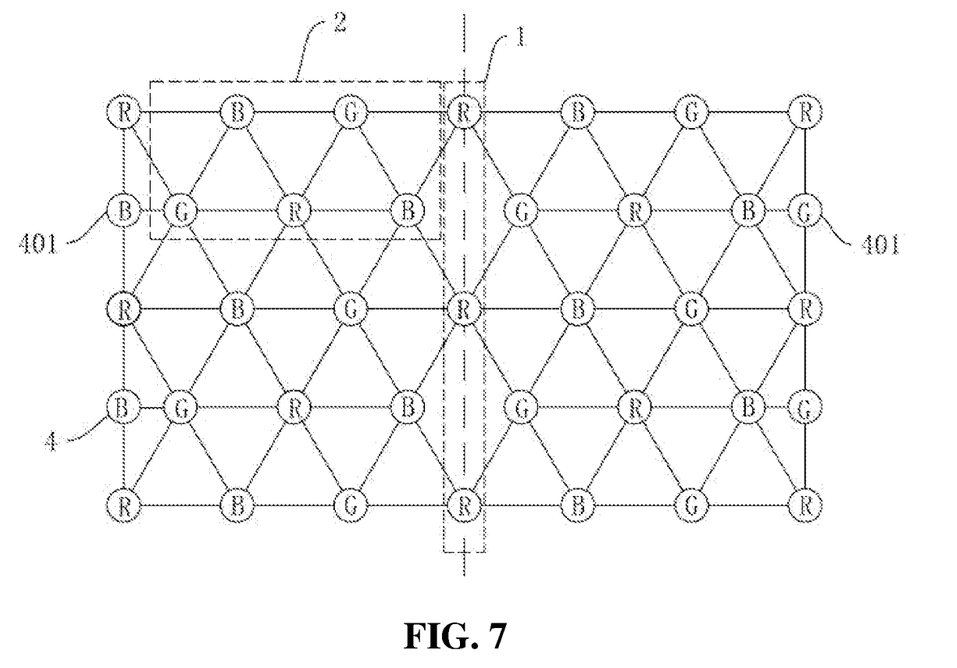
FIG. 7 is a schematic diagram of the present application for illustrating the coordination relationship between the location of a complementary color position and the adjacent pixels in some embodiments.

Specifically, with reference to FIG. 6, the adjacent pixels of the two adjacent second pixel sets 2 also form a white light zone by enclosing an RGB area. Specifically, the four pixels in a lower portion of the above regular hexagonal structure are divided into two matched pairs on the left and right, that is, the pixel A 202 of the second pixel set 2 located above and the pixel B 203 in the second pixel set 2 located below form a matched pair, and the pixel D 205 in the second pixel set 2 located above and the pixel B of the pixel C 204 set below 203 form a mating pair. The matched pair and the center pixel 201 on the adjacent reconstruction locations cooperate to form third white light zones 304, the adjacent two second pixel sets 2 separately control the on-off of their own pixels, and cooperate with the first pixel set 1 to control the on-off of their own center pixel 201, thereby controlling the on-off of the third white light zones 304. The E pixels on the reconstruction locations can not only form a first reconstruction white light point with the reconstruction pairs, but also form a third reconstruction white light point with the matched pairs, so that the pixel arrangement is more uniform, thereby avoiding visual pixel graininess, obtaining a higher pixel density and improving the resolution of the display panel.

Further, in the present embodiment, a complementary color position is provided between the reconstruction locations on the edge of the pixel arrangement structure, a third pixel set 4 is arranged on the complementary color position, the third pixel set 4 includes complementary color sub-pixels, the complementary color sub-pixel is a pixel A 202 or a pixel B 203, the complementary color position is opposite to the adjacent pixel A 202 or pixel D 205, the complementary color position relative to the pixel A 202 is used to add the complementary color sub-pixel of the pixel B 203, and the complementary color position relative to the pixel D 205 is used to add the complementary color sub-pixel of the pixel A 202;

specifically, for liquid crystal display (LCD) technology, when straight lines are displayed, the edges thereof will produce solid color lines, for example, for FIG. 1, the top edge of the screen will produce a blue line, and the bottom edge will produce a red line. Similarly, the BOE delta arrangement is also prone to such phenomenon. Although the diamond arrangement does not produce sub-pixels of a single color in any straight line, due to the characteristics of easy to cause burn-in of OLED, the areas of the blue sub-pixel and red sub-pixel may be arranged larger correspondingly, so it is also prone to color fringing. However, in the present proposal, in order to reduce the phenomenon of single color fringing in the pixel arrangement structure, with reference to FIG. 7, in some embodiments, a complementary color position is provided between the reconstruction locations on the edge of the pixel arrangement structure, a third pixel set 4 is arranged on the complementary color position, the third pixel set 4 includes complementary color pixels 401, and the complementary color pixel 401 is a pixel A 202 or a pixel B 203. When the complementary color position is opposite to the adjacent pixel A 202 or pixel D 205, the complementary color position relative to the pixel A 202 is used to add the complementary color pixel 401 of the pixel B 203, and the complementary color position relative to the pixel D 203 is used to add the complementary color pixel 401 of the pixel A 202. At the edge of the screen, the second pixel set 2 and the third pixel set 4 are arranged on the same line, and the complementary color pixel 401 on the complementary color position form two white light emitting zones with the three adjacent pixels, alleviating the phenomenon of color lines generated at the edge of the screen.

Since the present solution is applicable to the mini-LED or micro-LED field, the present solution cannot be adopted for the LCD field to alleviate the phenomenon of color lines generated at the edge of the screen. LCD is a solution that filters the white backlight to get the desired color, and the concept of color mixing and light filtering is different from the present solution. In this field, LED is a point-surface light source that emits direct light outward and is visible in all directions, while LCD is a surface light source produced by backlight or side incident light after passing through a light guide plate, a brightness enhancement sheet, a polarizer and liquid crystal, the direction of the emitting light id determined, and the visible range is relatively small. Therefore, in the present solution, the distance between the adjacent center pixels 201 in the first pixel set 1 at the edge of the screen is greater than that between the center pixel 201 and the adjacent pixels, producing a less-obvious single color fringing, which is impossible for a light filter, at which point, the light filter will produce more obvious single color fringing.

The embodiment of the present application also discloses a display panel device, including a display panel composed of Micro/Mini-type red, green and blue LED flip-chips packaged using a PCB substrate or a glass substrate COB, and the display panel is provided with the above pixel arrangement structure.

What are described above are all preferred examples of the present application, and are not intended to limit the scope of protection of the present application. Therefore, equivalent changes made according to the structure, shape and principle of the present application should all fall within the scope of protection of the present application.

The invention claimed is:

1. An LED light emitting pixel arrangement structure, wherein the structure is used in the field of micro-LED or mini-LED self-light emitting display, comprising a plurality of first pixel sets and a plurality of second pixel sets, the second pixel set comprises a center pixel, pixels A, pixel B, pixel C, and pixel D, the pixel A, pixel B, pixel C, and pixel D take the center sub-pixel as a center and are sequentially distributed in a semicircular arc, the center pixel, pixel A, pixel B, pixel C, and pixel D are one of red light pixel, green light pixel or blue light pixel separately, the colors of the pixel C and the pixel D are the same as those of the pixel A and the pixel B separately, and the center pixel cooperates with any other two adjacent pixels to form an separate white light zone; and the first pixel set comprises a plurality of E pixels arranged in a row, the colors of the E pixels are the same as that of the center pixel, the second pixel set is located between the adjacent first pixel sets, the pixel A, pixel B, pixel C, and pixel D in the second pixel set are used as a reconstruction pair separately, the arrangement structure of the pixels forms a reconstruction location on the side of the reconstruction pair away from the center pixel, the E pixels in the first pixel set are arranged on the reconstruction location and cooperate with the adjacent reconstruction pairs to form a first reconstruction white light zone, and control modes of the first pixel set 1 and the second pixel set 2 are both separate electric control, to control an on-off order and frequency of the separate white light zone and the first reconstruction white light zone.

2. The LED light emitting pixel arrangement structure according to claim 1, wherein the center pixel is arranged in an equilateral triangle with any corresponding pair of the reconstruction pair, and the reconstruction pair and the E pixel on the corresponding reconstruction location are arranged in an equilateral triangle with.

3. The LED light emitting pixel arrangement structure according to claim 2, wherein the second pixel set is arranged longitudinally in a single row between the adjacent first pixel sets, in any of the two second pixel sets adjacent above and below, the pixel A, pixel B, pixel C and pixel D in the second pixel set located above form a regular hexagonal structure with the pixel B and pixel C in the second pixel set located below, the pixel A, pixel B, pixel C and pixel D in a lower portion of the regular hexagonal structure cooperate with the center pixel at the center of the regular hexagonal structure to form three second reconstruction white light zones, and the adjacent two second pixel sets control on-off of pixels inside the second pixel sets respectively, to control an on-off order and frequency of the second reconstruction white light zones.

4. The LED light emitting pixel arrangement structure according to claim 3, wherein the pixel A, the pixel B, the pixel C, and the pixel D in a lower portion of the regular hexagonal structure are divided into two matched pairs on the left and right, the matched pairs and the E pixels on the adjacent reconstruction positions cooperate to form third white light zones, the adjacent two second pixel sets separately control the on-off of their own pixels, and the first pixel sets control the on-off of their own E pixels to control the on-off of the third white light zones.

5. The LED light emitting pixel arrangement structure according to claim 1, wherein a complementary color position is provided between the reconstruction locations on the edge of the pixel arrangement structure, a third pixel set is arranged on the complementary color position, the third pixel set comprises complementary color sub-pixels, the complementary color sub-pixel is a pixel A or a pixel B, the complementary color position is opposite to the adjacent pixel A or pixel D, the complementary color position relative to the pixel A is used to add the complementary color sub-pixel of the pixel B, and the complementary color position relative to the pixel D is used to add the complementary color sub-pixel of the pixel A.

6. The LED light emitting pixel arrangement structure according to claim 1, wherein the center pixel is a red light pixel, the pixel A is a blue light pixel, the pixel B is a green light pixel, the pixel C is a blue light pixel, and the pixel D is a green light pixel;

or, the center pixel is a red light pixel, the pixel A is a green light pixel, the pixel B is a blue light pixel, the pixel C is a green light pixel, and the pixel D is a blue light pixel;

or, the center pixel is a blue light pixel, the pixel A is a red light pixel, the pixel B is a green light pixel, the pixel C is a red light pixel, and the pixel D is a green light pixel;

or, the center pixel is a blue light pixel, the pixel A is a green light pixel, the pixel B is a red light pixel, the pixel C is a green light pixel, and the pixel D is a red light pixel;

or, the center pixel is a green light pixel, the pixel A is a red light pixel, the pixel B is a blue light pixel, the pixel C is a red light pixel, and the pixel D is a blue light pixel; and or, the center pixel is a green light pixel, the pixel A is a blue light pixel, the pixel B is a red light pixel, the pixel C is a blue light pixel, and the pixel D is a red light pixel.

7. A display panel device, comprising a display panel composed of Micro/Mini-type red, green and blue LED flip-chips packaged by using a PCB substrate or a glass substrate COB, and the display panel is provided with the above pixel arrangement structure according to claim 1.

* * * * *